(12) United States Patent
Jessep et al.

(10) Patent No.: US 6,941,537 B2
(45) Date of Patent: Sep. 6, 2005

(54) STANDOFF DEVICES AND METHODS OF USING SAME

(75) Inventors: Rebecca A. Jessep, Dallas, OR (US); David W. Boggs, Hillsboro, OR (US); Carolyn McCormick, Hillsboro, OR (US); John H. Dungan, Hillsboro, OR (US); Daryl A. Sato, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 552 days.

(21) Appl. No.: 10/067,244

(22) Filed: Feb. 7, 2002

(65) Prior Publication Data

US 2003/0145460 A1 Aug. 7, 2003

(51) Int. Cl.[7] .............................................. G06F 17/50
(52) U.S. Cl. ............................................. 716/15; 716/1
(58) Field of Search ........................................ 716/15, 1

(56) References Cited

U.S. PATENT DOCUMENTS

| | | | | |
|---|---|---|---|---|
| 4,750,092 A | * | 6/1988 | Werther | 361/783 |
| 4,816,896 A | * | 3/1989 | Owens | 206/726 |
| 4,823,234 A | * | 4/1989 | Konishi et al. | 361/718 |
| 5,557,150 A | * | 9/1996 | Variot et al. | 257/787 |
| 5,633,535 A | * | 5/1997 | Chao et al. | 257/778 |
| 6,356,448 B1 | * | 3/2002 | DiBene et al. | 361/721 |
| 6,665,194 B1 | * | 12/2003 | Patel et al. | 361/767 |

* cited by examiner

*Primary Examiner*—Stacy A. Whitmore
*Assistant Examiner*—Sun James Lin
(74) *Attorney, Agent, or Firm*—Schwegman, Lundberg, Woessner & Kluth, P.A.

(57) ABSTRACT

A standoff device provides predetermined control of a standoff distance between electrical components mounted together with opposing conductive grid array patterns. In an embodiment, a predetermined electrical function is provided by the device to at least one of the electrical components. The standoff device comprises a plurality of rigid one-piece standoff pins which, in an embodiment, contains one or more stops which buttress against the electrical components to serve as a distancing control structure. In an embodiment, the standoff device is integral with one of the electrical components.

63 Claims, 5 Drawing Sheets

US 6,941,537 B2

STANDOFF DEVICES AND METHODS OF USING SAME

FIELD

The present invention is directed to standoff arrangements to control distance and provide electrical function.

BACKGROUND

The performance requirements for semiconductor devices continue to increase. Performance may be improved, for example, with the addition of further input and output signal connections. To accommodate these additional connections in small surface mount packages, soldered grid array technology has been used and continues to develop. As one example, Bump/Ball Grid Arrays (BGAs) have conductive bumps/balls (e.g., solder and/or conductive-filled polymer) arranged in a conductive grid array pattern and serving as the connectors. This density is further increased in MicroBGAs (μBGA) and Chip Scale Packages (CSPs). As advantages, the higher density BGA reduces package size, and also helps lead to decreased printed circuit board (PCB) size, shorter leads/interconnections, reduced weight, improved electrical performance, and/or decreased cost.

With regard to gaining widespread use, both reliability of semiconductor packages and low cost of manufacture may help promote maximized package adoption/use. The BGA package conductive bumps/balls are the package's interface with the receiving substrate printed circuit board (e.g., PCB) upon which the BGA package is mounted. It has been found within research directed toward the present invention that the reliability of this interface can sometimes be affected by package standoff distance. If used between a PCB and a package, standoff distance may be, for example, the distance from the top plane of the PCB to the bottom edge of the BGA package after mounting. It has been found in the present research that the inability to control Surface Mount Technology (SMT) assembly deviations in standoff distance can lead to solder collapse and low cyclic fatigue life.

In addition to physical integrity, electrical performance is another consideration of conductive grid array (as well as any) mounting technology. More particularly, as system functions increase, package power demand (e.g., electrical current conduction) likewise may increase. Such current may be delivered through the PCB layers to the die through some of the conductive bumps/balls, but as they become smaller, the conductive bumps/balls may not be able to handle a required electrical current conduction capacity, or an excessive number of conductive bumps/balls may be required to do so. Further, other electrical components/functions (e.g., resistors, capacitors, inductors) may be required in the area proximate to the conductive grid array, which may place limits on the conductive grid array design.

Needed are arrangements to control semiconductor package standoff distance, and to provide convenient electrical functions.

BRIEF DESCRIPTION OF THE DRAWINGS

The foregoing, and a better understanding of the present invention, will become apparent from the following detailed description of example embodiments, and the claims, when read in connection with the accompanying drawings, all forming a part of the disclosure of this invention. While the foregoing, and following, written and illustrated disclosure focuses on disclosing example embodiments of the invention, it should be clearly understood that the same is by way of illustration and example only, and that the invention is not limited thereto. The spirit and scope of the present invention are limited only by the terms of the appended claims.

The following represents brief descriptions of the drawings, wherein.

DETAILED DESCRIPTION

Figure 1:
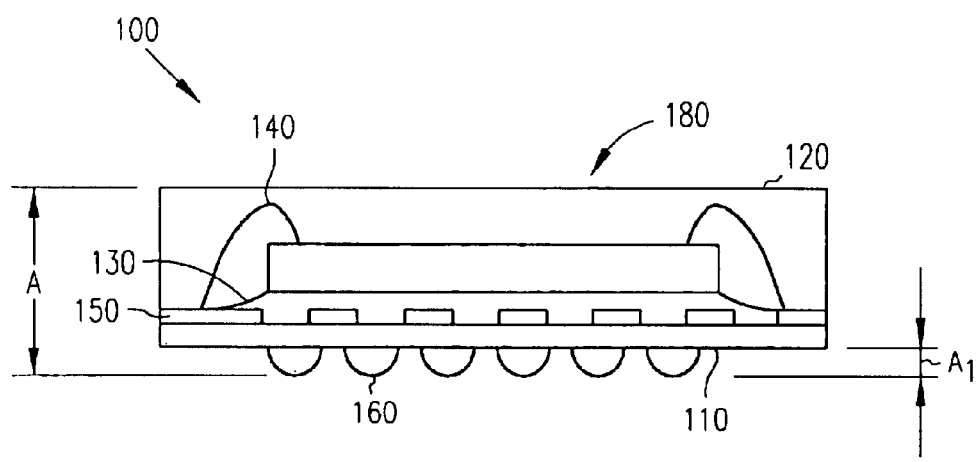
FIG. 1 is a side view of an example BGA package useful in explanation and understanding of background and example embodiments of the present invention.

Before beginning a detailed description of the subject invention, mention of the following is in order. When appropriate, like reference numerals and characters may be used to designate identical, corresponding or similar components in differing figure drawings. Further, in the detailed description to follow, example sizes/models/values/ranges may be given, although the present invention is not limited to the same. Well-known power/ground connections to substrates, ICs and other components may not be shown in great detail within the FIGs. for simplicity of illustration and discussion, and so as not to obscure the invention. Further, arrangements may be shown in simplistic diagram form in order to avoid obscuring the invention, and also in view of the fact that specifics with respect to implementation of such diagram arrangements are highly dependent upon the platform within which the present invention is to be implemented, i.e., specifics should be well within the purview of one skilled in the art. Where specific details are set forth in order to describe example embodiments of the invention, it should be apparent to one skilled in the art that the invention can be practiced without, or with, variation of these specific details.

While the following detailed description will describe example embodiments of arrangements in the context of an example BGA arrangement having conductive bumps/balls as a conductive grid array, practice of the present invention is not limited to such context, i.e., practice of the present invention may have uses with other types of chips and with other types of mounting and packaging techniques. For example, practice of the present invention may be able to be made in the context of the aforementioned μBGA and/or CSP arrangements.

Turning now to the detailed description, FIG. 1 relates to a cross-sectional view of an example BGA package useful in explanation and understanding of background and example embodiments of the present invention. More particularly, FIG. 1 illustrates a BGA package 100 formed on a substrate 110 having a die 120 mounted thereto, and hermetically sealed with die attach material 130. Illustrated are conductive (e.g., gold) wires 140 for electrical interfacing from example power or group 1 planes 150 to die 120. The BGA package 100 itself may be mounted on another substrate or PCB through conductive bumps/balls 160 on the bottom of the package. The package may be contained in an encapsulation 180.

The FIG. 1 substrate 110 may be, for example, a multi-layered/laminated BT (Bismaleimide Triazine) laminate rigid substrate. The die 120 may be, for example, a bumped Flip Chip (FC) die joined with conductive bumps/balls and conductive pads (not shown in great detail) to the substrate 110, such joints forming electrical connections between the die and the package. The die attach material 130 may be, for example, an epoxy underfill filling a gap between the die and the substrate so as to provide mechanical support, protection for the die-to-package interconnects, and to maintain attachment/connection integrity despite cyclic thermal stresses (e.g., stresses resulting from a die-to-package mismatch of coefficient of thermal expansion (CTE) and the on/off operation of the device).

The BGA package 100 may have an example package height A of 2.0 mm (see FIG. 1). The conductive bumps/balls 160 may be utilized in whole or in part as electrical interconnections for signal, power and/or ground inputs/outputs to the die. The conductive bump/ball 160 height $A_1$ may be an example 0.635 mm. There may be, for example, multiple (e.g., two) dies 120 within a single BGA package 100, and each may be separately connected with conductive (e.g., gold) wires 140 (e.g., in a stacked CSP). Such BGA package 100 is subsequently mounted to a PCB (shown hereafter in FIG. 4).

Figure 2:
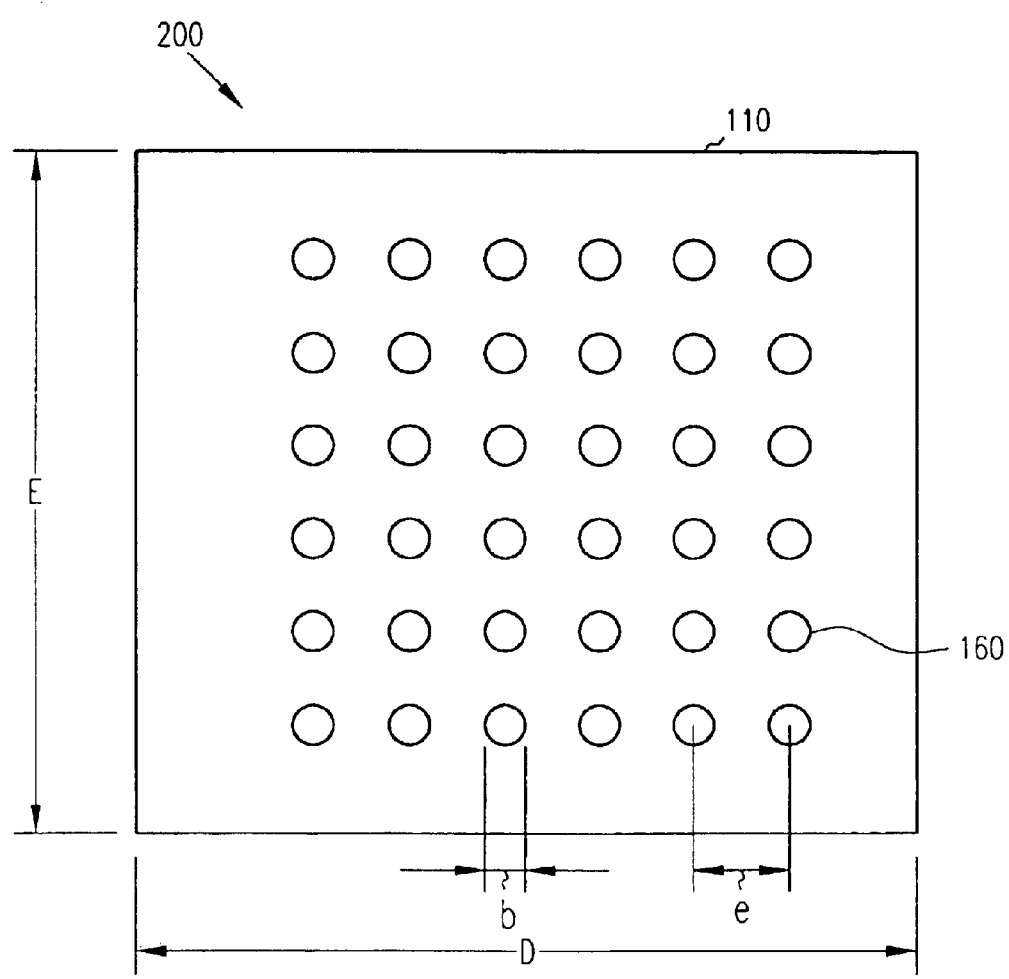
FIG. 2 is a bottom view of an example substrate of FIG. 1.

Turning next to FIG. 2, there is shown a bottom view of an example conductive BGA on a bottom of the FIG. 1 BGA substrate. More specifically, the bottom view 200 of the substrate 110 illustrates an example layout of the substrate's bottom side BGA. An example count of fifty-six conductive bumps/balls 160 is illustrated in the example arrangement, as arranged in rows and columns. The arrangement (e.g., number of conductive bumps/balls and grid array pattern) may vary to correspond to the transfer connections desired. For example, the number of conductive bumps/balls may be variable to meet package electrical, thermal and mechanical requirements. Illustrated are example industrial dimensions with an example conductive bump/ball having an example width b of 0.637 mm, and an example pitch e of 1.0 mm. The example package bottom view 200 also may have a package width D of 9.5 mm, and length E of 9.5 mm. The conductive bumps/balls 160 may be made of metal alloy such as a eutectic tin/lead mixture (e.g., 63% Sn/37% Pb), or may be a conductive-filled polymer. Besides having assigned conductive bumps/balls utilized for predetermined electrical connections, some reserve conductive bumps/balls may be further included and unassigned/reserved for future design use.

Figure 3:
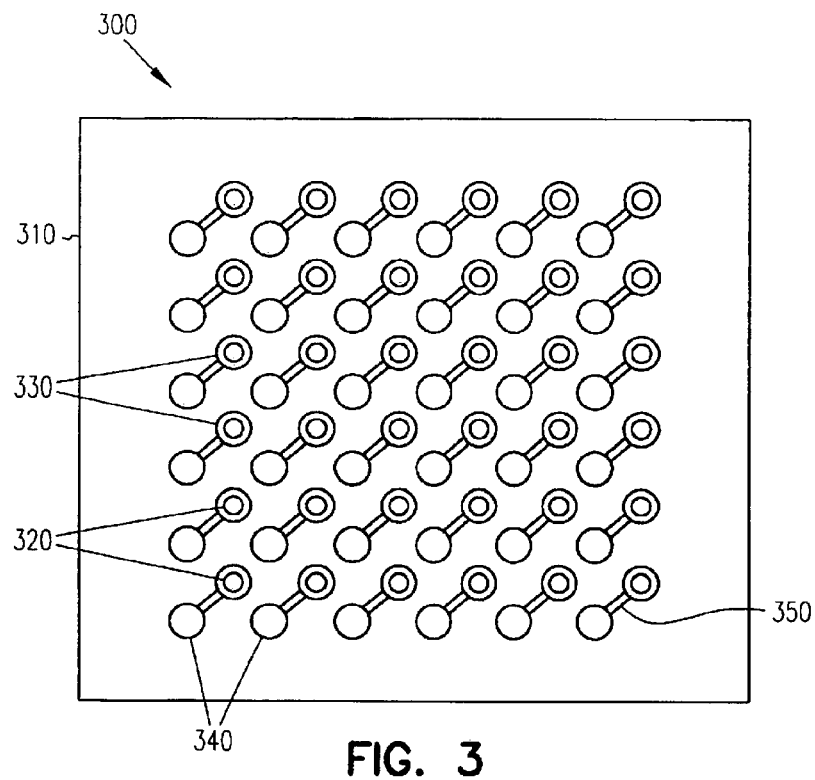
FIG. 3 is a top layer view of an example PCB that will mate with the FIG. 2 substrate.

Turning next to FIG. 3, there is shown a top view 300 of an example PCB 310 which will mate with the FIG. 2 substrate's (bottom-side) BGA. Illustrated are tops of example sets of via holes 320 encircled by pads 330, as well as lands 340 (composed of example conductive solder or conductive polymer and which physically connect to conductive bumps/balls of an opposing electrical component). Connective traces 350 electrically join the pads 330 and lands 340. The geometry and connectivity arrangement of pads, lands, vias, and traces may be of variable design.

Figure 4:
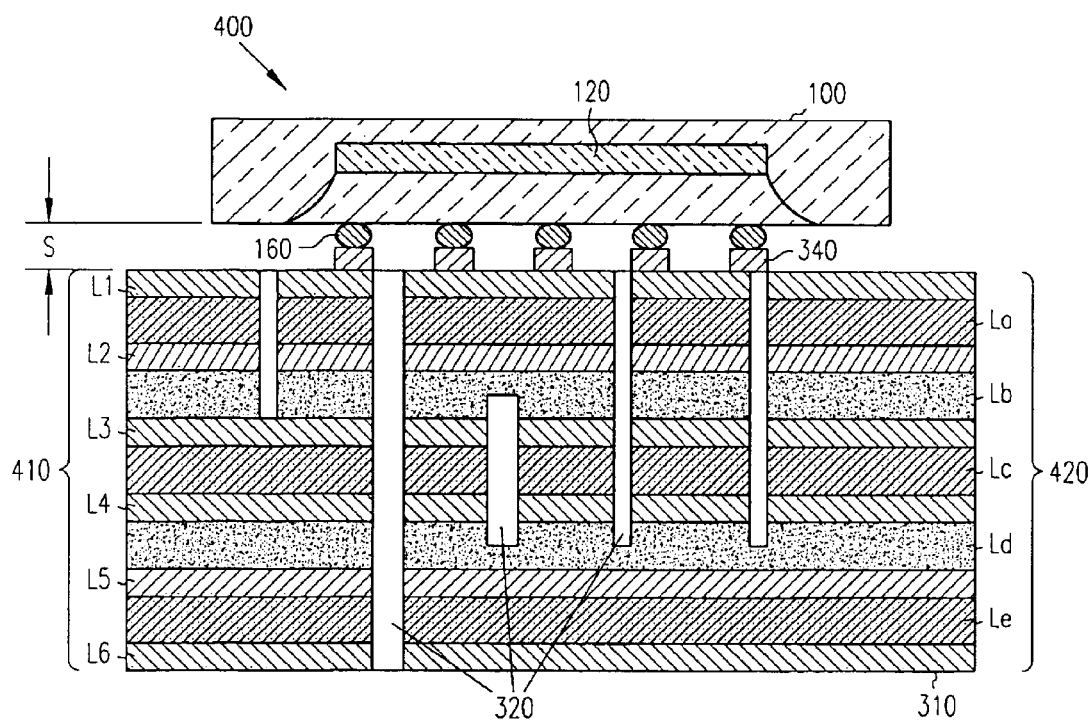
FIG. 4 is a cross-sectional side view of the PCB of FIG. 3, and further showing the FIGS. 1, 2 package mounted thereon in an uncontrolled standoff arrangement.

FIG. 4 illustrates a cross-sectional side view 400 of the FIG. 3 example PCB 310 with the FIGS. 1 and 2 BGA package 100 mounted thereon using an uncontrolled stand-off arrangement. Illustrated are the lands 340 upon which the BGA package conductive bumps/balls 160 are mounted. Also illustrated are example layers 410 designated as layers L1–L6, and example inter-layers 420 designated as inter-layers La–Le.

More particularly, the example FIG. 4 PCB shows six layers 410 with layers L1, L3, L4, and L6, for example, for signal transfer, layer L2 for power transfer, and layer L5 for grounding purposes. Each of the layers 410 may, for example, provide a singular function (e.g., power transfer) throughout an entirety of its layer, or may be sub-divided into differing areas to provide multiple differing functions (e.g., layer L2 may be sub-divided to provide partial signal transfer and partial power transfer functions). Signal, power and ground layers may be constructed of copper foil, for example.

Turning next to the inter-layers 420, inter-layers La, Lc, and Le may be of, for example, prepreg material, alternating with inter-layers Lb and Ld made of, for example, a copper-clad resin core. The prepreg material may be, for example, "pre-impregnated" fiberglass fabric saturated with a polymide, epoxy or other resin partially cured during a coating operation and deposited on the fabric. The core material may be copper clad resin. Vias 320 may extend in a variety of lengths/arrangements, for example, may extend totally through the PCB (see FIG. 4), extend totally within the PCB, or connect to one side of the PCB from one of the inner layers.

During mounting, alignment is important in that, if the conductive bumps/balls 160 are not aligned with lands 340, the bump-/ball-to-land connections are not reliable (e.g., they can disadvantageously short-circuit with neighboring lands and/or pads). Further, lack of co-planarity of conductive bumps/balls and lands may also inhibit reliable connections (i.e., some of the opposing conductive bumps/balls and lands may be unable to touch due to non-planarity, thereby never completing the electrical conduction path).

In the uncontrolled standoff arrangement of FIG. 4, electrical functions (e.g., power, ground and signals) may be supplied to the BGA package from PCB lamination planes through the connecting vias and lands, and then through the conductive bumps/balls 160. As disadvantages, each conductive bump/ball (due to its limiting small size and easily meltable material) is limited to the amount of power (e.g., electrical current amount) which it may carry. Use of a plurality of conductive bumps/balls to meet a power handling demand of a single electrical function (e.g., electrical current supply) may be a solution, but use of a plurality of conductive bumps/balls for a single function may be unacceptable in practice, as the number of conductive bumps/balls to be shared by all functions may be limited. Accordingly, electrical interfacing may be limited by ball size and quantity. Due to such limitations, note that the FIG. 1 example conductive (e.g., gold) wires 140 may have to be used to provide additional connection paths.

As further disadvantages within the FIG. 4 uncontrolled standoff environment, there is no predictability of either conductive bump/ball-to-land alignment or standoff distance S. Turning first to alignment discussions, during assembly, the package's BGA may be placed on the receiving substrate having had solder paste applied thereto (e.g., during a surface mount assembly process). During heating/melting and solder joint formation, cohesion between the conductive bumps/balls on the BGA and the lands may help to partially self-align to the pads on the board by surface tension of the molten solder, and upon assembly completion, the solder joints may help to hold the BGA package onto the surface of the PCB. However, the solder jointing self-alignment (cohesion) phenomena can by no means itself guarantee alignment, e.g., if the components being mounted together are vastly misaligned during assembly, the solder jointing alignment (cohesion) phenomena will not correct vast misalignment.

As further related alignment discussions, while the above-discussed conductive (e.g., gold) wires 140 may serve to improve electrical performance, the conductive (e.g., gold) wires 140 do nothing to help with alignment, and in fact, are often applied at an assembly stage subsequent to the alignment/solder-jointing stage.

Turning next to standoff variation discussions, variation in S (see FIG. 4) may result in immediate yield failure, or a low cyclic fatigue life over time. For example, standoff variation may result in conductive bump/ball collapse during manufacture. A strong bump/ball-to-pad joint will not occur if the conductive bump/ball collapses from the stress of BGA mounting. Low standoff distance S can be responsible for cracking and premature failure at a package conductive bump/ball and land interface. While larger conductive bump/ball-and-pad joints may be used to offer more mechanical resistance to standoff variations and/or collapse, such solution is not practical in the real world interests of achieving smaller and smaller components and mounting arrangements.

Figure 5:
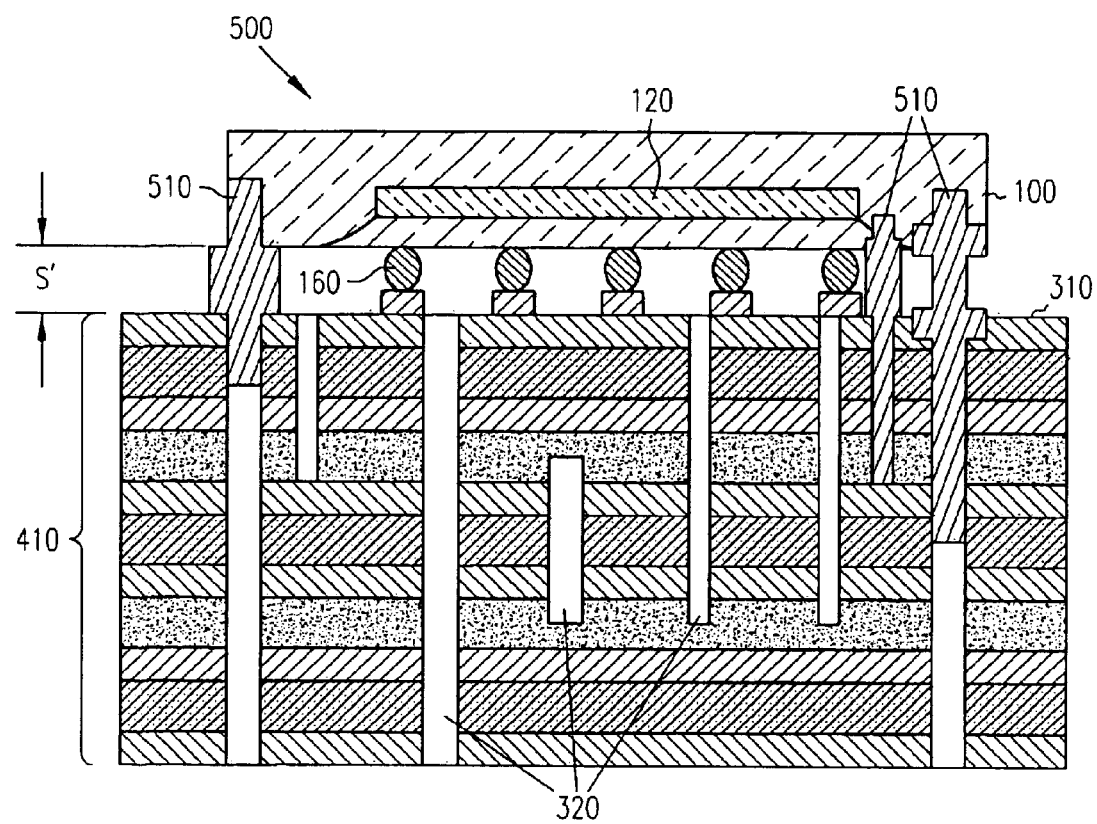
FIG. 5 is a cross-sectional side view similar to that of FIG. 4, but with a mounted BGA package having an advantageous arrangement of the present invention.

FIG. 5 illustrates a cross-sectional side view 500 of an example (advantageous) embodiment of the present invention with standoff arrangements, e.g., standoff/power pins 510, between the BGA package 100 and the PCB 310. These standoff/power pins may be separately provided/installed structures, or may be integrated with the BGA, or with the PCB component. The standoff component may be of any suitable shape or size including, foe example, the shape of the illustrated pins, bar-shaped, or alternatively rectangular or frame shaped.

The FIG. 5 example standoff/power pin maybe constructed essentially of rigid material, and may have suitable standoffs having a predetermined rigid standoff thickness of at least one portion thereof (e.g., stops) to buttress against and hold the BGA package at a fixed predetermined (standoff) distance from the receiving substrate. This provides an improved controlled standoff distance S', and may help to reduce or manage thermal/mechanical stresses which may occur to differing BGA connections during the standard life of the product. This reduction or greater control (e.g., uniformity) in stress due to controlled standoff can increase the reliability of the BGA connections at the PCB/component interface, as stresses are distributed more equally. In one embodiment at least a portion of at least one pin of a plurality of rigid standoff pins has either a dumbbell shape or a rolling-pin share wherein protruding portions of the dumbbell shape and the rolling-pin shape buttress against the electrical components to serve as the distancing control structure to control the standoff distance.

As to additional assembly requirements, example suitable methods/times of adding the standoff arrangements (standoff/power pins) may include installation during a SMT assembly operation, as any standoff arrangements may be held on through any solder paste. An alternative installation time might be at a pick-and-place operation. In either method, the standoff arrangement may be able to be held in place by solder or other conductive material applied at a wave operation.

In addition to standoff, the example embodiment in FIG. 5 also may be used to provide another (dual) function of providing an electrical path or function to at least one of the opposing electrical components (e.g., the interfacing substrate and receiving substrate) of the arrangement. For example, the standoff/power pins also may be used to increase efficient power delivery. As one example, the standoff/power pins may be attached and electrically connected to a receiving substrate's power or ground layer 410 to directly provide an electrical conduction path to the BGA package 100. The delivery of power/ground through the standoff/power pins lessens the dependency on vias and conductive bumps/balls as a conduit for power or ground, and frees up some conductive bumps/balls for other uses. Further, at least some of the FIG. 1 conductive (e.g., gold) wires 140 may be able to be eliminated as the standoff/electrical device (e.g., standoff/power pin) arrangement can be used as an electrical conduction path instead. As another embodiment, the pin can be arranged to provide an electrical path with respect to only one of the substrates. For example, the pin may provide an electrical path from one electrical plane to a differing electrical plane within the same substrate. With the FIG. 5 embodiment helping to improve routing of power and signals, a side advantage is that the PCB layers may be able to be better optimized for cost and performance.

Since a weight/assembly pressure of the BGA package may now be borne by the standoff/power pins rather than the conductive bumps/balls, smaller conductive bumps/balls may be able to be used so as to achieve a grid array of increased density within a same-size grid array. Alternatively, an existing grid array could be made smaller to enable a smaller package size, allowing for construction of smaller electrical devices. The FIG. 5 example embodiment standoff/power pin may be alternatively applicable to other devices that have reduced control of standoff distance, such as multi-chip modules.

Figure 6:
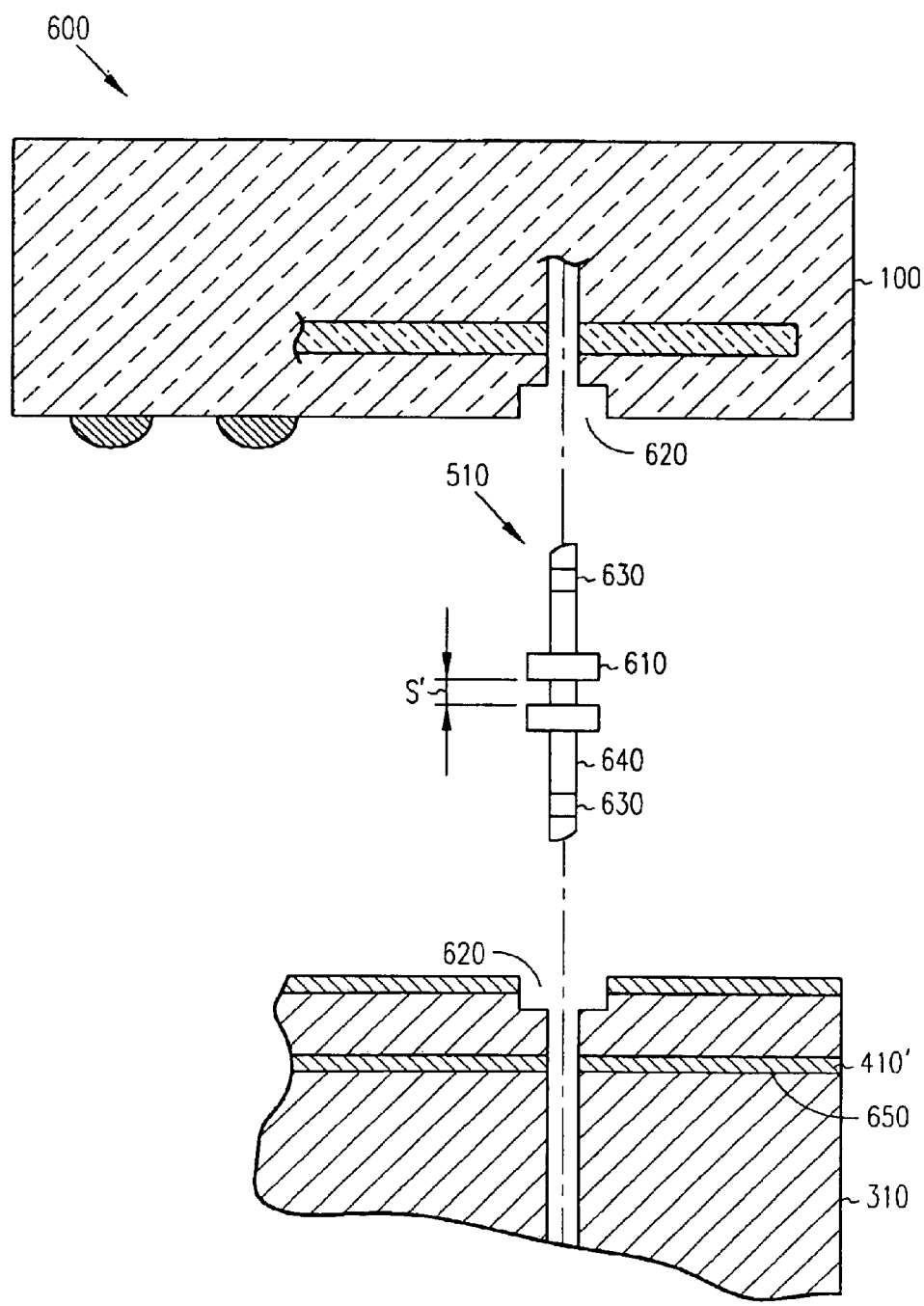
FIG. 6 is a magnified cross-sectional side view of a portion of the arrangement of FIG. 5 and illustrating an example embodiment with a countersink standoff/power pin arrangement.

FIG. 6 illustrates a magnified cross-sectional view 600 of an example standoff/power pin 510 between receiving substrate 310 and BGA package 100. An example standoff/power pin may be constructed of a rigid, electrically conductive material, and may be formed, for example, through any standard mold, stamp, etch, extrude and deposit manufacturing processes. The standoff/power pin should be capable of withstanding temperatures of at least the assembly process and a normal electrical package operation.

The illustrated standoff/power pin structure has example platforms (shelves) 610 which, when the standoff/power pins are positioned in countersinks 620 in the BGA package 100 and in the receiving substrate 310, buttress against such components so as to control the standoff distance of the BGA package in relation to the receiving substrate. When the package is assembled, the mounted rigid standoff/power pin will enable a standoff distance S' between the BGA package and the receiving substrate to be controlled dependent on the distance between the platforms (shelves) 610, and the depth of the countersinks 620. Alternatively, the countersinks may be absent and the platforms (shelves) could rest on, and be attached to, a package surface. In another embodiment, one or more platforms (shelves) may be absent, with the standoff distance determined by the length of the standoff/power pin structure relative to the standoff/power pin mounting depth.

As mentioned previously, the standoff/power pin may be constructed of a material that will allow the standoff/power pin to also perform electrical functions, e.g., serve as an electrical conduction path from the receiving substrate layers to the BGA package. The standoff/power pin may be of a solid material in monolithic construction, or alternatively, may be of a more complex multi-layered construction such as having differing conductive surfaces 630 and insulated surfaces 640. Power delivery from the receiving substrate 310 to the BGA package 100 may be improved as the conductive surface 630 of each standoff/power pin may be designed to directly contact an example PCB power layer 410' and an example power plane 150 when the standoff/power pin is installed upon mounting. Alternatively, the standoff/power pin may be designed to contact a receiving substrate's ground layer and receiving substrate's ground plane.

Figure 7:
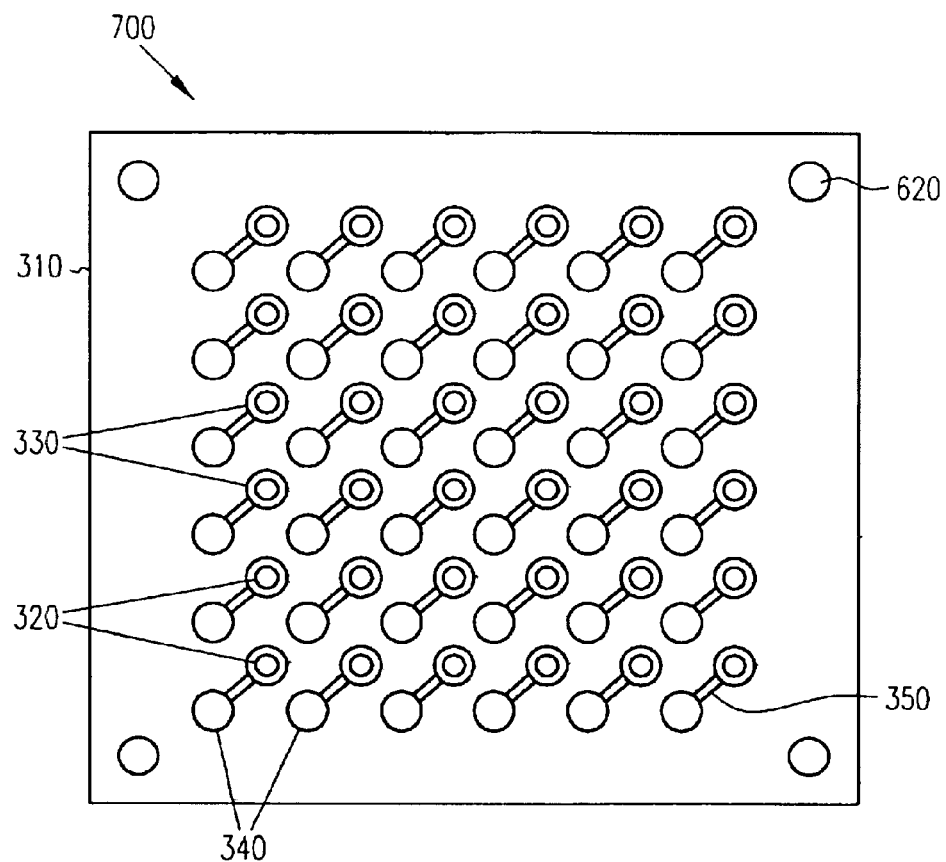
FIG. 7 is a top view of a PCB similar to FIG. 3, but illustrating an example placement of countersinks for one example embodiment of the present invention.

FIG. 7 is top view 700 of a receiving substrate 310 similar to FIG. 3, but showing an example placement of countersinks 620 for the standoff/power pins. In the example embodiment, the receiving substrate and BGA have through-holes 650 (see FIG. 6) matched for standoff/power pin placement. Such through-holes can, with proper planning and design, be used to greatly improve alignment of the conductive grid array components of the opposing receiving substrate and BGA during the assembly/mounting processes. Practice of the present invention is not limited to the FIG. 7 arrangement in that, for example, the standoff/power pin placement may have alternative geometries for alignment of different packages, with alternative numbers of the standoff/power pins. Further, the standoff/power pin may have alternative multiple extensions of varying length, allowing contact with varied receiving substrate layers and BGA planes (lamination layers) with varied electrical connections. In other example embodiments, the present invention shape may be of varied geometries (e.g., rectangular) to facilitate alternate arrangements for contact with receiving substrate layers and BGA planes.

Figure 8:
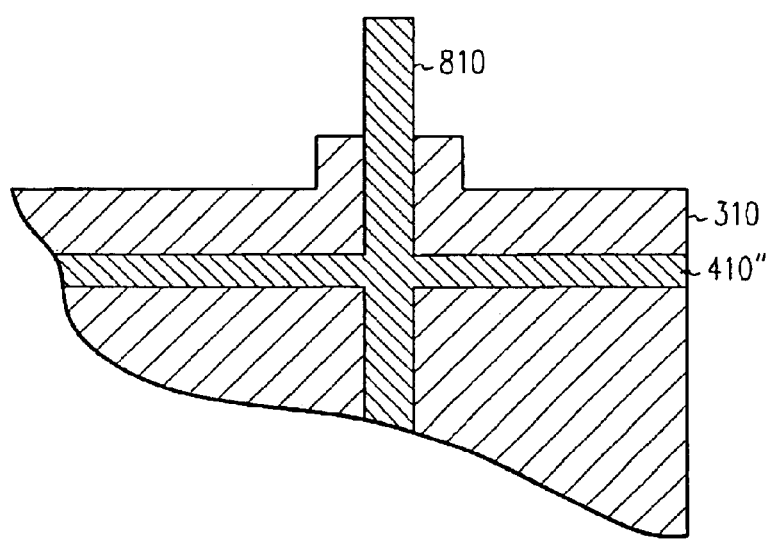
FIG. 8 is a partial side view showing an example integrated standoff/power pin arrangement as an alternative example embodiment of the present invention.

FIG. 8 illustrates another example embodiment of a standoff/power pin arrangement 810 which is monolithic, or integrated, with the receiving substrate 310 structure, and layer 410". Alternatively, the standoff/power pin may be monolithic, or integrated, with the BGA structure. To lower manufacturing costs, an integrated structure may incorporate the standoff/power pin without countersinks.

As a further embodiment, rather than providing simple electrical conduction path functions, the standoff/power pins may be able to be designed to provide other types of electrical functions to one or both of the electrical components being mounted together. In a simplistic example, the standoff/power pin may be constructed of a rigid but electrically resistive material, to result in a tubular resistor. Continuing with another example, the standoff/power pin could be of a more complex, multi-layered construction having conductive material inner and outer layers separated by an intermediate dielectric material layer, to result in a tubular capacitor. More particularly, an outer conductive layer of the standoff/power pin may serve as a first plate of the capacitor, while an inner conductive layer may serve as a second plate of the capacitor, with an insulating or dielectric layer being disposed therebetween. In this example embodiment, the standoff/power pin could serve a double function, both in control of standoff distance and as a capacitance device. Such dual standoff/capacitance arrangement may be particularly useful with dies, packages, etc. requiring decoupling capacitors.

It should be noted that, in such a situation, the capacitive-type standoff/power pin may be providing an electrical function solely to a single substrate rather than electrically interfacing the two substrates. As one example, the capacitive device could serve as an electrical path/device for one of the substrates in that the inner conductive layer and the outer conductive layer could be electrically connected to the same substrate, while the capacitive device is electrically insulated from the other substrate. However, the standoff/power pin would still provide physical interfacing by contacting both substrates to control the standoff distance. As yet another example, the standoff/power pin may be formed into a tubular inductor, or may be of an even more complex construction containing ones of resistors, capacitors and inductors, to result in, for example, a complex impedance arrangement, an electronic filter arrangement, and so forth.

In conclusion, reference in the specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other embodiments. Furthermore, for ease of understanding, certain method procedures may have been delineated as separate procedures; however, these separately delineated procedures should not be construed as necessarily order dependent in their performance, i.e., some procedures may be able to be performed in an alternative ordering, simultaneously, and so forth.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

While the foregoing example embodiments illustrate using the standoff arrangements of the present invention to provide dual standoff control and electrical function between a package and another substrate, practice of alternative embodiments of the present invention may also have uses providing dual standoff control and electrical function between other types of items. This includes, for example, providing standoff/electrical-functions between stacked dies, between a die and a substrate, and so forth. Further, the standoff arrangements are not limited to standoff/power pins, or to arrangements that penetrate the components (e.g., substrates) to which it provides the standoff or electrical function. Finally, practice of the various embodiments of the present invention is not limited to arrangements providing the standoff and electrical functions equal to one another. For example, an embodiment may have standoff/electrical-function arrangements in which standoff/power pins have a primary purpose of power delivery, and a lesser function of standoff distance control, or vice versa.

What is claimed is:

1. A standoff/electrical device comprising:
   a standoff device arrangement to provide predetermined control of a standoff distance between electrical components mounted together with opposing conductive grid array patterns, wherein the standoff device arrangement comprises a plurality of rigid one-piece standoff pins; and
   an electrical function structure to provide a predetermined electrical function to at least one of the electrical components.

2. The standoff/electrical device of claim 1, wherein the plurality of rigid one-piece standoff pins have a mating relationship with at least one of the electrical components and a distancing control structure to control the standoff distance, with at least a sub-plurality of the plurality of rigid one-piece standoff pins having the electrical function structure.

3. The standoff/electrical device of claim 2, wherein the distancing control structure comprises one or more stops on at least one pin of the plurality of rigid one-piece standoff pins which buttress against the electrical components.

4. The standoff/electrical device of claim 1, wherein the predetermined electrical function is selected from the group consisting of an electrical conduction path function, a resistor function, a capacitor function, an inductor function, and any combination thereof.

5. The standoff/electrical device of claim 1, wherein at least one of the electrical components is a printed circuit board (PCB), further wherein the conductive grid array patterns are selected from the group consisting of a bump/ball grid array (BGA), a micro BGA ($\mu$BGA), a land grid, array, a pad grid array, and any combination thereof.

6. The standoff/electrical device of claim 1, wherein the standoff/electrical device is composed either substantially entirely of electrical-conductive material or constructed to have at least two differing areas composed of a material selected from the group consisting of electrical-conductive material, electrical-resistive material, electrical-insulative material, electrical-dielectric material, electrical-inductor material, and any combination thereof.

7. The standoff/electrical device of claim 1, wherein the standoff/electrical device is provided integrally as part of one of the electrical components.

8. The standoff/electrical device of claim 1, wherein the standoff/electrical device comprises alignment structure to substantially align the opposing conductive grid array patterns of the electrical components during mounting together thereof.

9. Mounted components comprising:
   at least two electrical components having opposing conductive grid array patterns for electrical connection thereof;
   a standoff device to provide predetermined control of a standoff distance between electrical components mounted together with opposing conductive grid array patterns, wherein the standoff device comprises a plurality of rigid one-piece standoff pins; and
   an electrical function structure to provide a predetermined electrical function to at least one of the electrical components.

10. The mounted components of claim 9, wherein the plurality of rigid one-piece standoff pins have a mating relationship with at least one of the electrical components and a distancing control structure to control the standoff distance, with at least a sub-plurality of the plurality of rigid one-piece standoff pins having the electrical function structure.

11. The mounted components of claim 10, wherein the distancing control structure comprises one or more stops on at least one pin of the plurality of rigid one-piece standoff pins which buttress against the electrical components.

12. The mounted components of claim 9, wherein the predetermined electrical function is selected from the group consisting of an electrical conduction path function, a resistor function, a capacitor function, an inductor function, and any combination thereof.

13. The mounted components of claim 9, wherein at least one of the electrical components is a printed circuit board (PCB), further wherein the conductive grid array patterns are selected from the group consisting of a bump/ball grid array (BGA), a micro BGA ($\mu$BGA), a land grid, a pad grid array, and any combination thereof.

14. The mounted components of claim 9, wherein the electrical function structure is composed either substantially entirely of electrical-conductive material or constructed to have at least two differing areas composed of a material selected from the group consisting of electrical-conductive material, electrical-resistive material, electrical-insulative material, electrical-dielectric material, electrical-inductor material, and any combination thereof.

15. The mounted components of claim 9, wherein the standoff device is provided integrally as part of one of the electrical components.

16. The mounted components of claim 9, wherein the standoff device comprises alignment structure to substantially align the opposing conductive grid array patterns of the electrical components during mounting together thereof.

17. A components-mounting method comprising:
   mounting at least two electrical components having opposing conductive grid array patterns for electrical connection thereof; and
   interposing a standoff device to provide predetermined control of a standoff distance between the at least two electrical components mounted together with opposing conductive grid array patterns, wherein the standoff device comprises a plurality of rigid one-piece standoff pins; and
   providing an electrical function structure to provide a predetermined electrical function to at least one of the electrical components.

18. The method of claim 17, wherein the plurality of rigid one-piece standoff pins have a mating relationship with at least one of the electrical components and a distancing control structure to control the standoff distance, with at least a sub-plurality of the plurality of rigid one-piece standoff pins having the electrical function structure.

19. The method of claim 18, wherein the distancing control structure comprises one or more stops on at least one pin of the plurality of rigid one-piece standoff pins which buttress against the electrical components.

20. The method of claim 17, wherein the predetermined electrical function is selected from the group consisting of an electrical conduction path function, a resistor function, a capacitor function, an inductor function, and any combination thereof.

21. The method of claim 17, wherein at least one of the electrical components is a printed circuit board (PCB), further wherein the conductive grid array patterns are selected from the group consisting of a bump/ball grid array (BGA), a micro BGA ($\mu$BGA), a land grid array, a pad grid array, and any combination thereof.

22. The method of claim 17, wherein the standoff device is composed either substantially entirely of electrical-conductive material or constructed to have at least two differing areas composed of a material selected from the group consisting of electrical-conductive material, electrical-resistive material, electrical-insulative material, electrical-dielectric material, electrical-inductor material, and any combination thereof.

23. The method of claim 17, comprising providing the standoff device integrally as part of one of the electrical components.

24. The method claim of claim 17, comprising providing the standoff device with alignment structure to substantially align the opposing conductive grid array patterns of the electrical components during mounting together thereof.

25. A standoff/electrical device comprising a standoff member having a predetermined rigid standoff thickness and disposable between electrical components mounted together with opposing conductive grid array patterns to maintain a predetermined distance therebetween, wherein the standoff member comprises a plurality of grid one-piece standoff pins, the standoff member having an electrical path electrically connectable to at least one of the electrical components.

26. The standoff/electrical device of claim 25, wherein the plurality of rigid one-piece standoff pins have a mating relationship with at least one of the electrical components, with at least a sub-plurality of the plurality of rigid one-piece standoff pins having the electrical path.

27. The standoff/electrical device of claim 26, wherein the predetermined rigid standoff thickness comprises one or more stops on at least one pin of the plurality of rigid one-piece standoff pins which buttress against the electrical components.

28. The standoff/electrical device of claim 25, wherein the electrical path is selected from the group consisting of a substantially non-resistive electrical path, a resistive electrical path, a capacitive electrical path, an inductive electrical path, and any combination thereof.

29. The standoff/electrical device of claim 25, wherein at least one of the electrical components is a printed circuit board (PCB), further wherein the conductive grid array patterns are selected from the group consisting of a bump/ball grid array (BGA), a micro BGA ($\mu$BGA), a land grid array, a pad grid array, and any combination thereof.

30. The standoff/electrical device of claim 25, wherein the standoff/electrical device is composed either substantially entirely of electrical-conductive material or constructed to have at least two differing areas composed of a material selected from the group consisting of electrical-conductive material, electrical-resistive material, electrical-insulative material, electrical-dielectric material, electrical-inductor material, and any combination thereof.

31. The standoff/electrical device of claim 25, wherein the standoff/electrical device is provided integrally as part of one of the electrical components.

32. The standoff/electrical device of claim 25, wherein the standoff/electrical device comprises a first aligner of predetermined shape engageable with a second aligner on at least one of the electrical components to substantially align the opposing conductive grid array patterns of the electrical components during mounting together thereof.

33. Mounted components comprising:
at least two electrical components having opposing conductive grid array patterns for electrical connection thereof; and
a standoff/electrical device including a standoff member having a predetermined rigid standoff thickness and disposable between the at least two electrical components mounted together with the opposing conductive grid array patterns to maintain a predetermined distance therebetween, wherein the standoff member comprises a plurality of rigid one-piece standoff pins, the standoff member having an electrical path electrically connectable to at least one of the at least two electrical components.

34. The mounted components of claim 33, wherein the plurality of rigid one-piece standoff pins have a mating relationship with at least one of the at least two electrical components, with at least a sub-plurality of the plurality of rigid one-piece standoff pins having the electrical path.

35. The mounted components of claim 34, wherein the predetermined rigid standoff thickness comprises one or more stops on at least one pin of the plurality of rigid one-piece standoff pins which buttress against the electrical components.

36. The mounted components of claim 33, wherein the electrical path is selected from the group consisting of a substantially non-resistive electrical path, a resistive electrical path, a capacitive electrical path, an inductive electrical path, and any combination thereof.

37. The mounted components of claim 33, wherein at least one of the at least two electrical components is a printed circuit board (PCB), and wherein the conductive grid array patterns are selected from the group consisting of a bump/ball grid array (BGA), a micro BGA ($\mu$BGA), a land grid array, a pad grid array, and any combination thereof.

38. The mounted components of claim 33, wherein the standoff/electrical device is composed either substantially entirely of electrical-conductive material or constructed to have at least two differing areas composed of a material selected from the group consisting of electrical-conductive material, electrical-resistive material, electrical-insulative material, electrical-dielectric material, electrical-inductive material, and any combination thereof.

39. The mounted components of claim 33, wherein the standoff/electrical device is provided integrally as part of one of the electrical components.

40. The mounted components of claim 33, where the standoff/electrical device comprises a first aligner of predetermined shape engageable with a second aligner on at least one of the at least two electrical components to substantially align the opposing conductive grid array patterns of the at least two electrical components during mounting together thereof.

41. A standoff/electrical device comprising:
a standoff device to provide predetermined control of a standoff distance between electrical components mounted together with opposing conductive grid array patterns, wherein the standoff device comprises a plurality of rigid one-piece standoff pins having a mating relationship with at least one of the electrical components and a distancing control structure to control the standoff distance, wherein the distancing control structure comprises one or more stops on at least one pin of the plurality of rigid one-piece standoff pins which buttress against the electrical components; and
an electrical function structure to provide a predetermined electrical function to at least one of the electrical components, wherein at least a sub-plurality of the plurality of rigid one-piece standoff pins have the electrical function structure.

42. The device of claim 41 wherein at least a portion of the at least one pin has a dumbbell shape or a rolling-pin shape.

43. The device of claim 41, wherein the predetermined electrical function is selected from the group consisting of an electrical conduction path function, a resistor function, a capacitor function, an inductor function, and any combination thereof.

44. The device of claim 41 wherein at least one of the electrical components is a printed circuit board (PCB), further wherein the conductive grid array patterns are selected from the group consisting of a bump/ball grid array (BGA), a micro BGA ($\mu$BGA), a land grid array, a pad grid array, and any combination thereof.

45. Mounted components comprising:
  at least two electrical components having opposing conductive grid array patterns for electrical connection thereof;
  a standoff device to provide predetermined control of a standoff distance between electrical components mounted together with opposing conductive grid array patterns wherein the standoff device arrangement comprises a plurality of rigid one-piece standoff pins having a mating relationship with at least one of the electrical components and a distancing control structure to control the standoff distance, wherein the distancing control structure comprises one or more stops on at least one pin of the plurality of rigid one-piece standoff pins which buttress against the electrical components; and
  an electrical function structure to provide a predetermined electrical function to at least one of the electrical components, wherein at least a sub-plurality of the plurality of rigid one-piece standoff pins have the electrical function structure.

46. The components of claim 45 wherein at least a portion of the at least one pin has a dumbbell shape or a rolling-pin shape.

47. The components of claim 45, wherein the predetermined electrical function is selected from the group consisting of an electrical conduction path function, a resistor function, a capacitor function, an inductor function, and any combination thereof.

48. The components of claim 45 wherein at least one of the electrical components is a printed circuit board (PCB), further wherein the conductive grid array patterns are selected from the group consisting of a bump/ball grid array (BGA), a micro BGA ($\mu$BGA), a land grid array, a pad grid array, and any combination thereof.

49. A components-mounting method comprising:
  mounting at least two electrical components having opposing conductive grid array patterns for electrical connection thereof;
  interposing a standoff device to provide predetermined control of a standoff distance between the at least two electrical components mounted together with opposing conductive grid array patterns, wherein the standoff device comprises a plurality of rigid one-piece standoff pins having a mating relationship with at least one of the electrical components and a distancing control structure to control the standoff distance, wherein the distancing control structure comprises one or more stops on at least one pin of the plurality of rigid one-piece standoff pins which buttress against the electrical components; and
  providing an electrical function structure to provide a predetermined electrical function to at least one of the electrical components, wherein at least a sub-plurality of the plurality of rigid one-piece standoff pins have the electrical function structure.

50. The components of claim 49 wherein at least a portion of the at least one pin has a dumbbell shape or a rolling-pin shape.

51. The method of claim 49, wherein the predetermined electrical function is selected from the group consisting of an electrical conduction path function, a resistor function, a capacitor function, an inductor function, and any combination thereof.

52. The method of claim 49 wherein at least one of the electrical components is a printed circuit board (PCB), further wherein the conductive grid array patterns are selected from the group consisting of a bump/ball grid array (BGA), a micro BGA ($\mu$BGA), a land grid array, a pad grid array, and any combination thereof.

53. A standoff/electrical device comprising a standoff member having a predetermined rigid standoff thickness and disposable between electrical components mounted together with opposing conductive grid array patterns to maintain a predetermined distance therebetween, the standoff member having an electrical path electrically connectable to at least one of the electrical components wherein the standoff member comprises a plurality of rigid one-piece standoff pins having a mating relationship with at least one of the electrical components, with at least a sub-plurality of the plurality of rigid one-piece standoff pins having the electrical path, wherein the predetermined rigid standoff thickness comprises one or more stops on at least one pin of the plurality of rigid one-piece standoff pins which buttress against the electrical components.

54. The device of claim 53 wherein at least a portion of the at least one pin has a dumbbell shape or a rolling-pin shape.

55. The device of claim 53 wherein the predetermined electrical function is selected from the group consisting of an electrical conduction path function, a resistor function, a capacitor function, an inductor function, and any combination thereof.

56. The device of claim 53 wherein at least one of the electrical components is a printed circuit board (PCB), further wherein the conductive grid array patterns are selected from the group consisting of a bump/ball grid array (BGA), a micro BGA ($\mu$BGA), a land grid array, a pad grid array, and any combination thereof.

57. Mounted components comprising:
  at least two electrical components having opposing conductive grid array patterns for electrical connection thereof; and
  a standoff/electrical device including a standoff member having a predetermined rigid standoff thickness and disposable between the at least two electrical components mounted together with the opposing conductive grid array patterns to maintain a predetermined distance therebetween, the standoff member having an electrical path electrically connectable to at least one of the at least two electrical components wherein the standoff member comprises a plurality of rigid one-piece standoff pins having a mating relationship with at least one of the at least two electrical components, with at least a sub-plurality of the plurality of rigid one-piece standoff pins having the electrical path, wherein the predetermined rigid standoff thickness comprises one or more stops on at least one pin of the plurality of rigid one-piece standoff pins which buttress against the electrical components.

58. The device of claim 57 wherein at least a portion of the at least one pin has a dumbbell shape or a rolling-pin shape.

59. The mounted components of claim 57 wherein the predetermined electrical function is selected from the group consisting of an electrical conduction path function, a resistor function, a capacitor function, an inductor function, and any combination thereof.

60. The mounted components of claim 57 wherein at least one of the electrical components is a printed circuit board (PCB), further wherein the conductive grid array patterns are selected from the group consisting of a bump/ball grid array (BGA), a micro BGA ($\mu$BGA), a land grid array, a pad grid array, and any combination thereof.

61. A standoff/electrical device comprising:

a standoff device to provide predetermined control of a standoff distance between electrical components mourned together with opposing conductive grid array patterns wherein the standoff device comprises a plurality of rigid one-piece standoff pins having a mating relationship with at least one of the electrical components and a distancing control structure to control the standoff distance, wherein the standoff device is provided integrally as part of one of the electrical components; and an electrical function structure to provide a predetermined electrical function to at least one of the electrical components, wherein at least a sub-plurality of the plurality of rigid one-piece standoff pins have the electrical function structure to provide the electrical function.

62. The device of claim 61 wherein the predetermined electrical function is selected from the group consisting of an electrical conduction path function, a resistor function, a capacitor function, an inductor function, and any combination thereof.

63. The device of claim 61 wherein at least one of the electrical components is a printed circuit board (PCB), further wherein the conductive grid array patterns are selected from the group consisting of a bump/ball grid array (BGA), a micro BGA ($\mu$BGA), a land grid array, a pad grid array, and any combination thereof.

* * * * *